(12) United States Patent
Chang et al.

(10) Patent No.: US 9,401,203 B1
(45) Date of Patent: Jul. 26, 2016

(54) MEMORY DRIVING CIRCUIT

(71) Applicants: Ningbo Advanced Memory Technology Corporation, Ningbo (CN); Being Advanced Memory Taiwan Limited, Hsinchu County (TW)

(72) Inventors: Jia-Hwang Chang, Hsinchu County (TW); Fan-Yi Jien, Hsinchu County (TW); Jui-Jen Wu, Hsinchu County (TW); Sheng-Tsai Huang, Hsinchu County (TW)

(73) Assignees: Ningbo Advanced Memory Technology Corporation, Ningbo (CN); Being Advanced Memory Taiwan Limited, Hsinchu County (TW)

( * ) Notice: Subject to any disclaimer, the term of this patent is extended or adjusted under 35 U.S.C. 154(b) by 0 days.

(21) Appl. No.: 14/818,334

(22) Filed: Aug. 5, 2015

(30) Foreign Application Priority Data

Apr. 16, 2015 (CN) .......................... 2015 1 0181486

(51) Int. Cl.
*G11C 13/00* (2006.01)
*G11C 5/14* (2006.01)

(52) U.S. Cl.
CPC ............ *G11C 13/0038* (2013.01); *G11C 5/147* (2013.01)

(58) Field of Classification Search
CPC ............................ G11C 13/0069; G11C 5/147

USPC .................................................. 365/148, 226
See application file for complete search history.

(56) References Cited

U.S. PATENT DOCUMENTS

| | | | | |
|---|---|---|---|---|
| 6,438,024 | B1* | 8/2002 | Gold ..................... | G11C 11/005 365/154 |
| 6,972,606 | B2* | 12/2005 | Ku ......................... | H03K 5/082 327/277 |
| 7,460,389 | B2 | 12/2008 | Hsu et al. | |
| 8,054,698 | B2* | 11/2011 | De Sandre .......... | G11C 13/0004 365/189.09 |
| 8,102,702 | B2 | 1/2012 | Chen | |
| 8,179,343 | B2* | 5/2012 | Sumioka .............. | G09G 3/3233 345/211 |

(Continued)

*Primary Examiner* — Michael Tran
(74) *Attorney, Agent, or Firm* — CKC & Partners Co., Ltd.

(57) ABSTRACT

A memory driving circuit includes a current source configured to output a second current, a first switching unit configured to undergo switching to connect to the current source selectively to output the second current, a voltage generating unit configured to provide a reference voltage, a capacitive energy storage unit configured to store energy according to the reference voltage, a third switching unit configured to undergo switching to connect the voltage generating unit and the capacitive energy storage unit selectively, a second switching unit configured to undergo switching to connect the capacitive energy storage unit selectively to output a third current, and a current output terminal configured to output the second current, the third current, or the sum of the second current and the third current.

11 Claims, 16 Drawing Sheets

(56) References Cited

U.S. PATENT DOCUMENTS

| | | | |
|---|---|---|---|
| 8,259,511 B2 | 9/2012 | Cho et al. | |
| 8,773,899 B2 | 7/2014 | Chen | |
| 2001/0036110 A1* | 11/2001 | Tomita | H03K 5/153 365/189.07 |
| 2005/0128784 A1* | 6/2005 | Kawashima | G11C 11/22 365/145 |
| 2006/0017496 A1* | 1/2006 | Yamada | G05F 1/465 327/540 |
| 2006/0186865 A1* | 8/2006 | Placa | G05F 1/56 323/273 |
| 2010/0226168 A1 | 9/2010 | Savransky | |
| 2011/0267287 A1* | 11/2011 | Bartling | G06F 3/041 345/173 |
| 2012/0252377 A1* | 10/2012 | Wachi | H03K 17/002 455/83 |
| 2012/0313606 A1* | 12/2012 | Jung, II | G05F 1/56 323/283 |
| 2013/0051139 A1 | 2/2013 | Dodge et al. | |
| 2016/0028302 A1* | 1/2016 | Low | H02M 3/073 363/50 |

\* cited by examiner

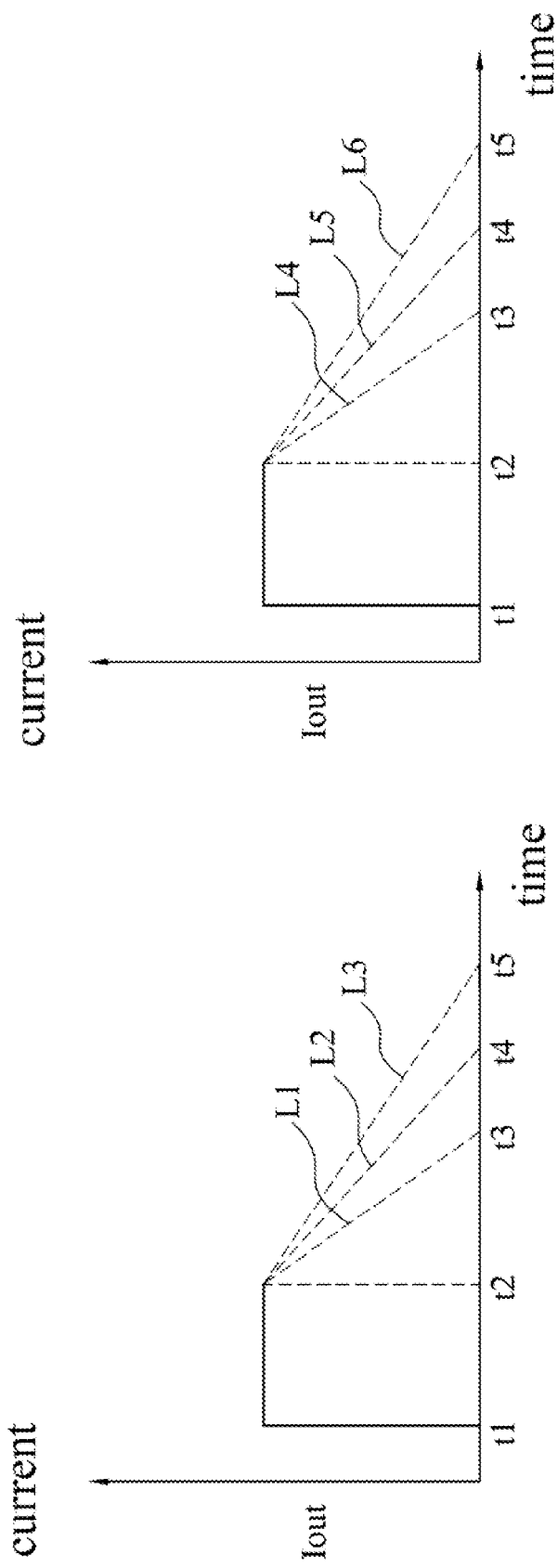

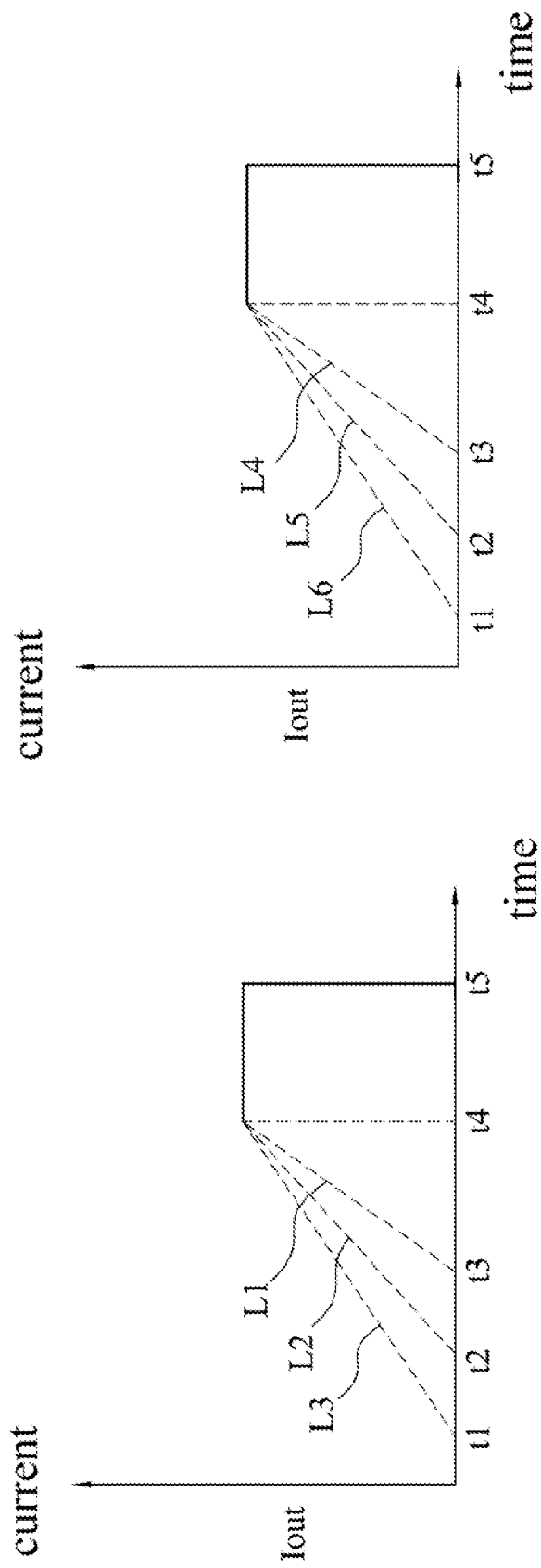

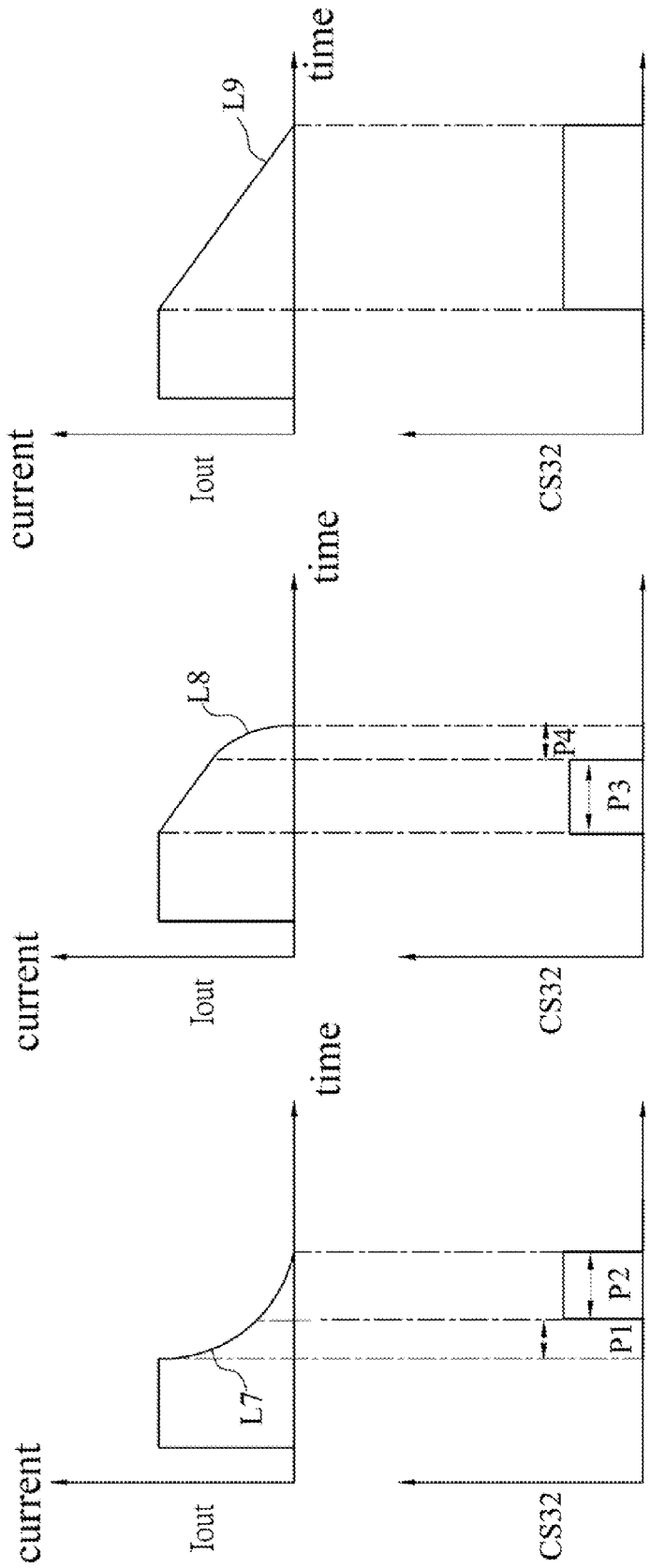

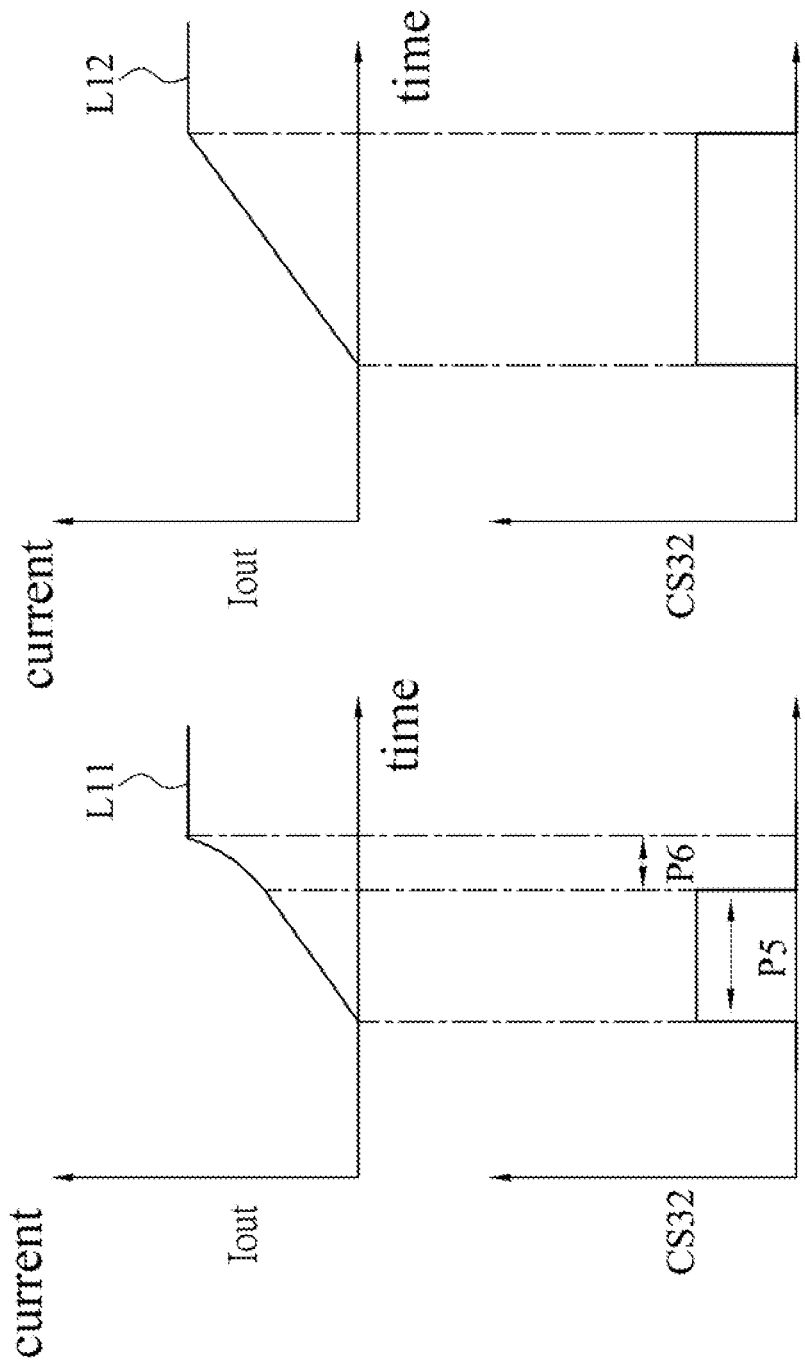

MEMORY DRIVING CIRCUIT

RELATED APPLICATIONS

This application claims priority to Chinese Application Serial Number 201510181486.8, filed Apr. 16, 2015, which is herein incorporated by reference.

BACKGROUND

1. Technical Field

The present disclosure relates to a memory driving circuit, and in particular, to a driving circuit configured to write a memristor memory.

2. Description of Related Art

The development of current memory technologies such as Dynamic Random. Access Memory (DRAM) and Static Random Access Memory (SRAM) is gradually maturing and facing physical limits for scaling. Therefore, developing new memory technologies for future memory applications is an important area of research in the related field. In this regard, the memristor memory includes phase change memory (PCM), resistive memory (ReRAM or RRAM) and Magnetoresistive memory (MRAM), and while these different types of memristor memories use different physics mechanisms to store data, they are all configured to read "1" or "0" by distinguishing the resistance value of the memory element. Phase change memory may be configured to change the resistance value of the element by varying the crystallization of its material, in order to store data by the change of the re stance value. When the material of the memory element is in crystalline state, a low resistance value is shown; on the other hand, when the material of the memory element is in an amorphous state, a high resistance value is shown.

However, memristor memories need a corresponding driving current to execute the write or erase operation. Therefore, the design of a driving circuit for memristor memories has become an important area of research in recent times, and is an area requiring improvement.

SUMMARY

One aspect of the present disclosure is a memory driving circuit. The memory driving circuit includes a current source, a first switching unit, a voltage generating unit, a capacitive energy storage unit, a third switching unit, a second switching unit and a current output terminal. The current source is configured to output a second current. The first switching unit is configured to undergo switching to connect to the current source selectively to output the second current. The voltage generating unit is configured to provide a reference voltage. The capacitive energy storage unit is configured to store energy according to the reference voltage. The third switching unit is configured to undergo switching to connect the voltage generating unit and the capacitive energy storage unit selectively. The second switching unit is configured to undergo switching to connect the capacitive energy storage unit selectively to output a third current. The current output terminal is configured to selectively output the second current, the third current, or the sum of the second current and the third current.

In summary, in the present disclosure, through application of the capacitive energy storage unit and the switching control of the switching units, the amplitude and the current change rate of the driving current during a fast transition stage and a slow transition stage may be adjusted simply. As a result, the shortcomings of using multiple current mirror circuits to adjust the driving current step-wisely are overcome, and in addition, the design structure of the memory driving circuit is simplified. Technical solutions of the present invention have advantages and beneficial effects compared to present technical solutions. The aforementioned technical solutions achieve significant progress in the field and can be widely used in industry.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows:

FIGS. 5A-5D are waveform diagrams illustrating the relationship between the driving current and time of the memory driving circuit according to an embodiment of the present disclosure.

FIGS. 6A-6C are schematic diagrams illustrating the relationship between control signals and the driving current according to an embodiment of the present disclosure.

FIGS. 7A 7B are schematic diagrams illustrating the relationship between control signals and the driving current according to an embodiment of the present disclosure.

DETAILED DESCRIPTION

Figure 1:
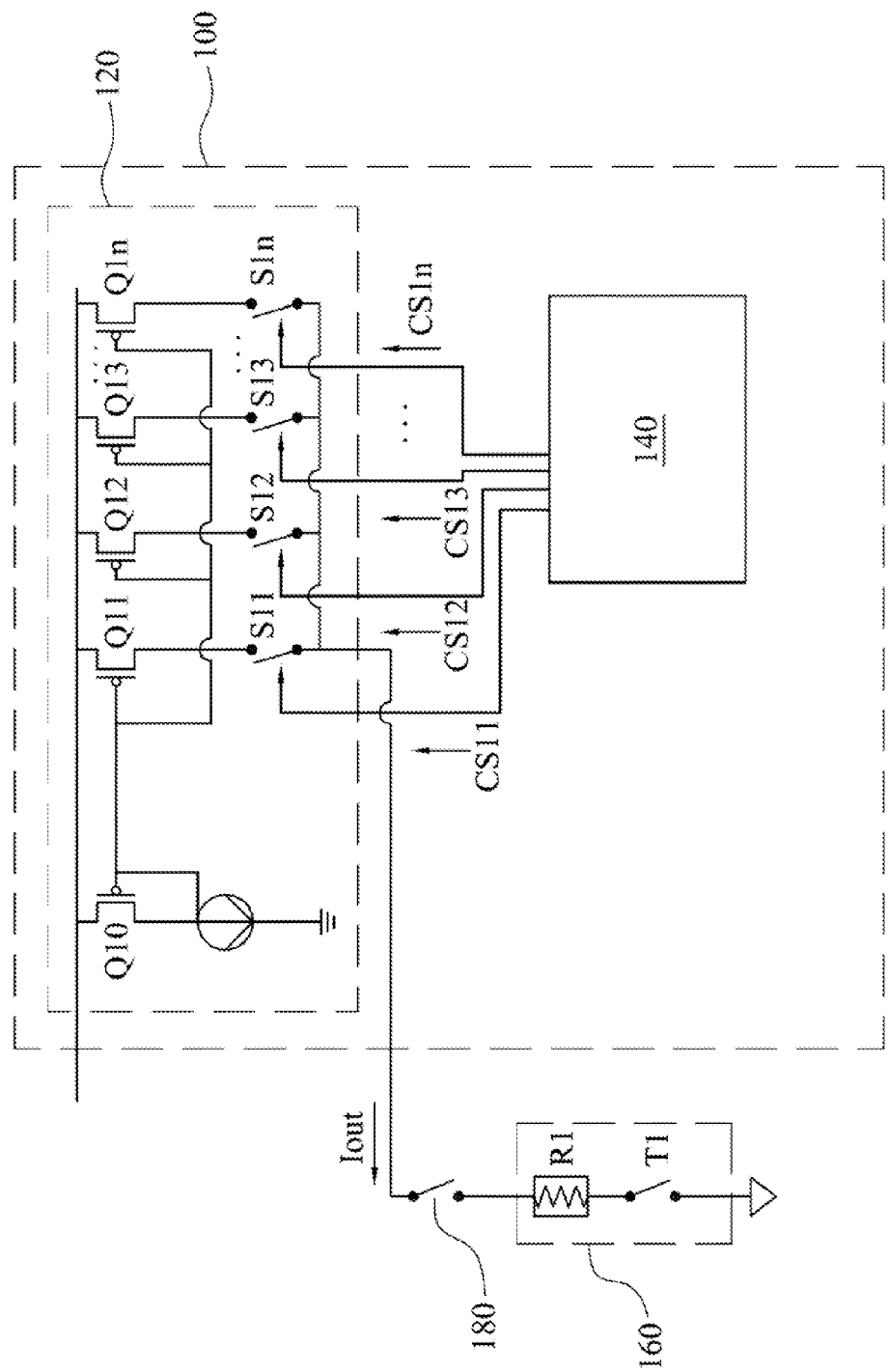
FIG. 1 is a schematic diagram illustrating a known memristor memory driving circuit.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

The terms "about" and "approximately" in the disclosure are used as equivalents. Any numerals used in this disclosure with or without "about," "approximately," etc. are meant to cover any normal' fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a schematic diagram illustrating a known memristor memory driving circuit 100. A Phase Change Memory (PCM) is taken as an example. As shown in FIG. 1, the memristor memory driving circuit 100 is configured to provide a driving current Iout to a memory cell 160. The memory cell 160 includes a programmable resistor R1 and a transistor T1, which form a basic one-transistor one-resistor (1T1R) structure. In some embodiments, the memory cell 160 may include one resistor R1 and one diode (1D1R), or one resistor R1 and multiple transistors or diodes connected in parallel (xT1R or xD1R). The memory cell 160 may change the resistance of the resistor R1 by the external driving current Iout to execute write or erase operations, and store information according to a high resistance state or a low resistance state of the resistor R1.

In the case of a Phase Change Memory (PC), the material of the memory cell 160 may be in a crystalline or amorphous state according to the change in temperature. Due to the fact that the conductivity characteristics of the memory cell 160 are different in the crystalline state and the amorphous state, information may be stored in the memory cell 160 by changing the crystal form via an appropriate driving current. When executing write and erase operations, in order to control the crystal form, the amplitude of the driving current needs to be controlled appropriately. Specific details in this regard will be described together with the drawings in the following paragraphs.

The memory driving circuit 100 includes a plurality of current mirror circuits 120 including a transistor Q10, transistor Q11~Q1$n$ and switches S11~S1$n$, and a control unit 140. The switches S11~S1$n$ are turned on or turned off selectively according to the control signals CS11~CS1$n$ outputted by the control unit 140 respectively to adjust the numbers of connected current mirror circuits 120 in order to control the amplitude of the driving current Iout.

Figure 2A:
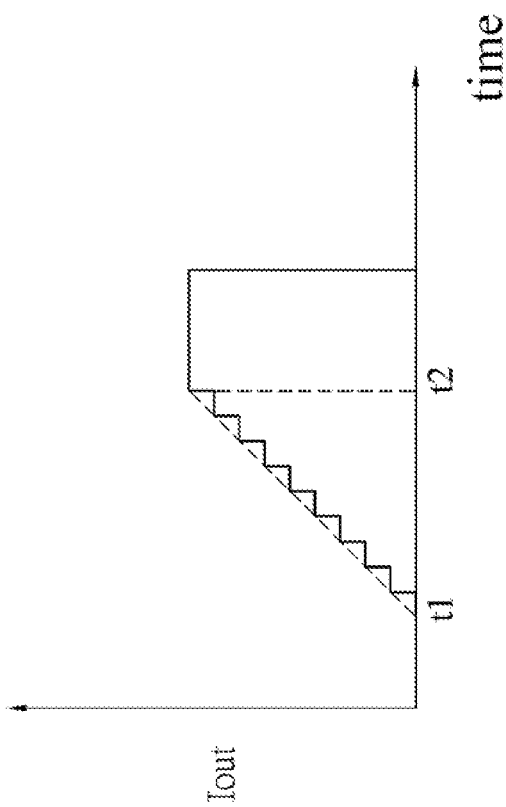
FIGS. 2A-2B are waveform diagrams illustrating the relationship between the output driving current and time of the memristor memory driving circuit shown in FIG. 1 in different stages.
Figure 2B:
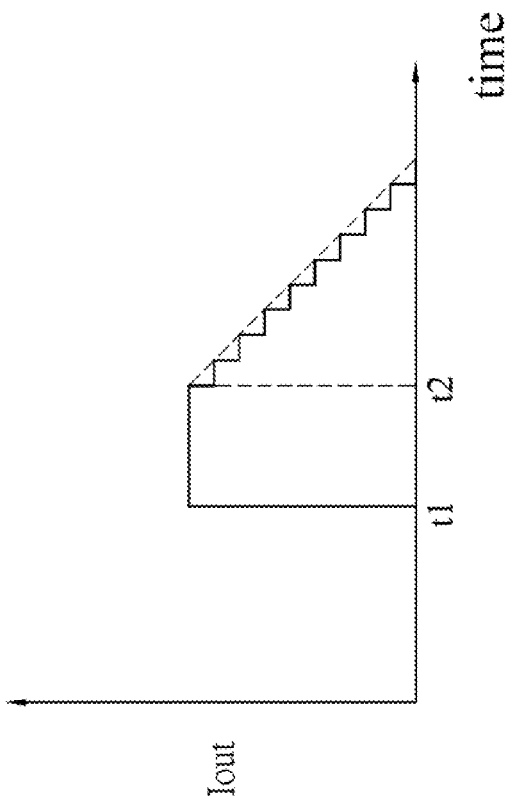

Reference is made to FIGS. 2A and 2B for the specific control method of the driving current Iout when executing write and erase operations. FIGS. 2A-2B are waveform diagrams illustrating the relationship between the output driving current Iout and time of the memory driving circuit 100 shown in FIG. 1 in different stages.

As shown in FIG. 2A, during the writing process, in order to control the crystal form of the material, the memory driving circuit 100 is configured to control the driving current Iout correspondingly in a fast transition stage and a slow transition stage.

First, during the fast transition stage between time t1 and t2, switches S11~S1$n$ are all turned ON such that every current mirror circuit 120 is enabled. Thus, the memory driving circuit 100 is configured to output a maximum current. Next, at time t2, the memory driving circuit 100 is shifted into the slow transition stage. During this stage, in order to control the driving current Iout to decrease gradually, the control unit 140 correspondingly turns OFF the switches S11~S1$n$ one by one via the control signals CS11~CS1$n$ such that the number of the conducting current mirror circuits 120 decreases gradually. Thus, during the slow transition stage, the memory driving circuit 100 may be configured to lower the output driving current Iout step-wisely.

Similarly, in the FIG. 2B, during the slow transition stage between time t1 and time t2, in order to control the driving current Iout to increase gradually, the control unit 140 correspondingly turns ON the switches S11~S1$n$ one by one via the control signals CS11~CS1$n$ such that the number of the conducting current mirror circuits 120 increases gradually. Thus, during the slow transition stage, the memory driving circuit 100 may be configured to increase the output driving current Iout step-wisely. Next, at time t2, the memory driving circuit 100 is shifted into the fast transition stage, and the switches S11~S1$n$ all turn ON such that every current or circuit 120 conducts. Thus, the memory driving circuit 100 is configured to output a maximum current.

However, in the aforementioned driving method, the driving current Iout during the slow transition stage changes in a stepwise manner, and large numbers of current mirror circuits are needed in the memory driving circuit 100 to smooth the changes of the driving current, which increases the circuit area and the complexity of the control.

Figure 3:
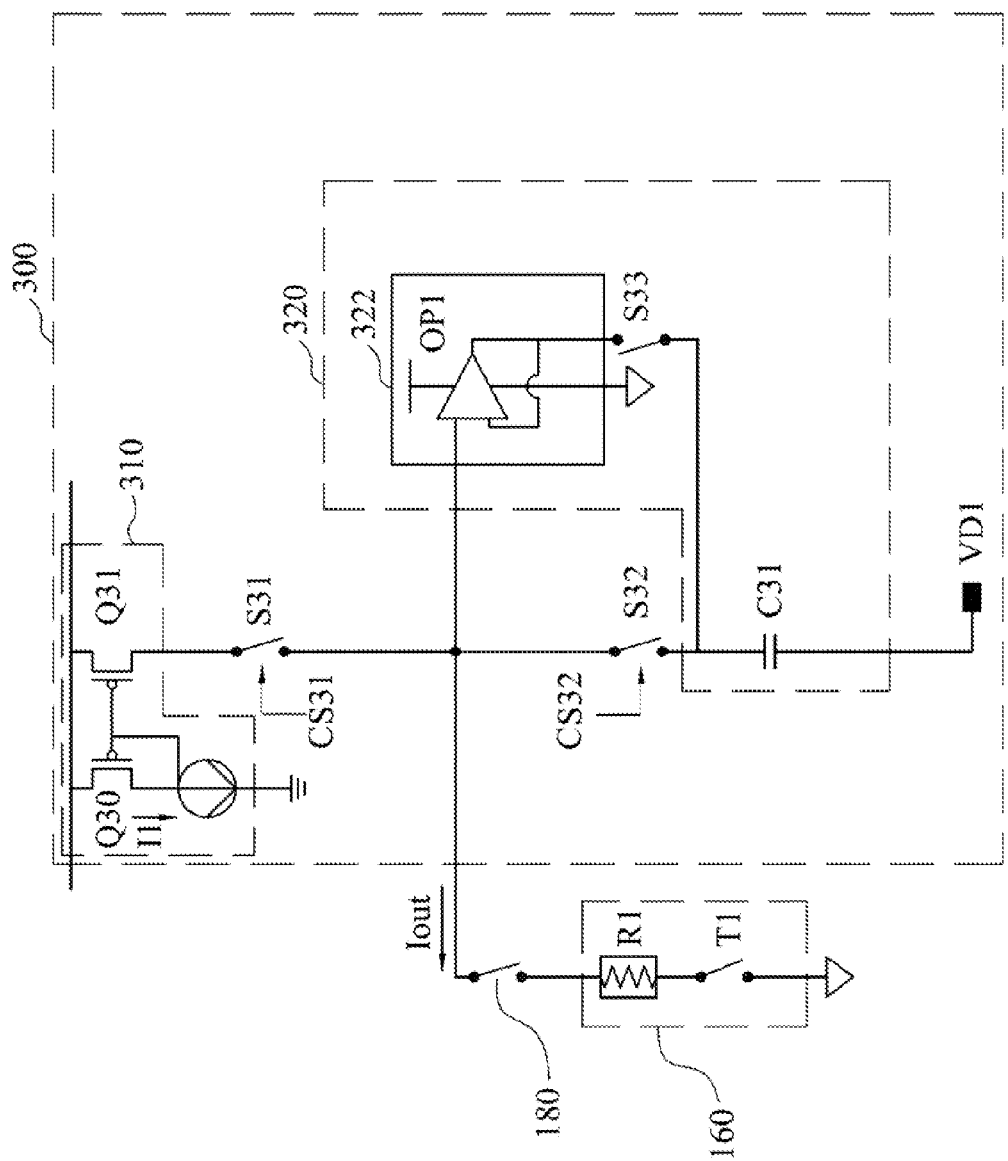
FIG. 3 is a schematic diagram illustrating a memory driving circuit according to an embodiment of the present disclosure.

To solve the problem stated above, a memory driving circuit is disclosed in the present disclosure to smoothly control the driving current Iout. Reference made to FIG. 3. FIG. 3 is a schematic diagram illustrating a memory driving circuit 300 according to an embodiment of the present disclosure.

In the present embodiment, the memory includes the memory driving circuit 300 and at least one memory cell 160. Each memory cell 160 includes a resistor R1 and a transistor T1 forming a basic one-transistor one-resistor (1T1R) structure, and is able to change the resistance of the resistor R1 by an external driving current Iout in order to execute write and erase operations. In the present example, the memory cell 160 may include a phase change memory (PCM), a resistive memory (ReRAM or RRAM) or a Magnetoresistive memory (MRAM).

When executing the write and erase operations on the memory cell 160, a word line in the memory enables the transistor T1 in the memory cell 160, and turn on the switching unit 160 correspondingly to provide the current path of the driving current Iout. Thus, in the memory array formed by a plurality of memory cells 160, by controlling the switches on the corresponding word lines and bit lines, the target memory cell may be configured to execute corresponding operations.

The memory driving circuit 300 includes a current source 310, a switching unit S31, a change rate controller 320, a switching unit S32 and a current output terminal 340. The change rate controller 320 includes a capacitive energy storage unit C31, a voltage generating unit 322 and a switching unit S33. The switching unit S31 is electrically connected between the current source 310 and the memory cell 160. The switching unit S32 is electrically connected between the capacitive energy storage unit C31 and the switching unit S31, and electrically connected to a terminal of the voltage generating unit 322 and a driving current (Iout) terminal. The switching unit. S33 is electrically connected between another terminal of the voltage generating unit 322 and the capacitive energy storage unit C31. One terminal of the capacitive energy storage unit C31 is electrically connected to the voltage source VD1. The switching units S31, S32, and S33 may be electrically connected to a processor unit (not shown), and configured to be turned on or be turned off selectively according to control signals (e.g. control signals CS31, CS32) outputted by the process unit respectively.

As shown in FIG. 3, the current source 310 may include a current mirror circuit including a transistor Q30 and a transistor Q31, but the present disclosure is not limited thereto. One skilled in the art may apply other know current mirror circuits in the present embodiment without departing from the scope or spirit of the disclosure. The current source 310 is configured to output a corresponding second current I2 according to a first current I1. It is noted that, in the present embodiment, the corresponding second current I2 outputted by the current source 310 may be designed to be equivalent to the total output current when the current mirror circuits 120 all turn ON at the same time, as shown in FIG. 1. Alternatively stated, the current mirror circuit in the embodiment shown in FIG. 3 may have the same level of maximum driving current as the current mirror circuit shown in FIG. 1.

The switching unit S31 is configured to selectively connect the current source 310 and the memory cell 160 according to the corresponding control signal CS31 such that the second current I2 is configured to drive the memory cell 160. The switching unit S32 is configured to selectively connect the capacitive energy storage unit C31 and the memory cell 160 according to the corresponding control signal CS32 to output a third current I3 such that the third current I3 is configured to drive the memory cell 160. Thus, according to the operation of switching units S31 and S32, the current output terminal 340 may be configured to selectively output the second current I2, the third current I3, or the sum of the second current I2 and the third current I3 to provide the driving current Iout.

Figure 4A:
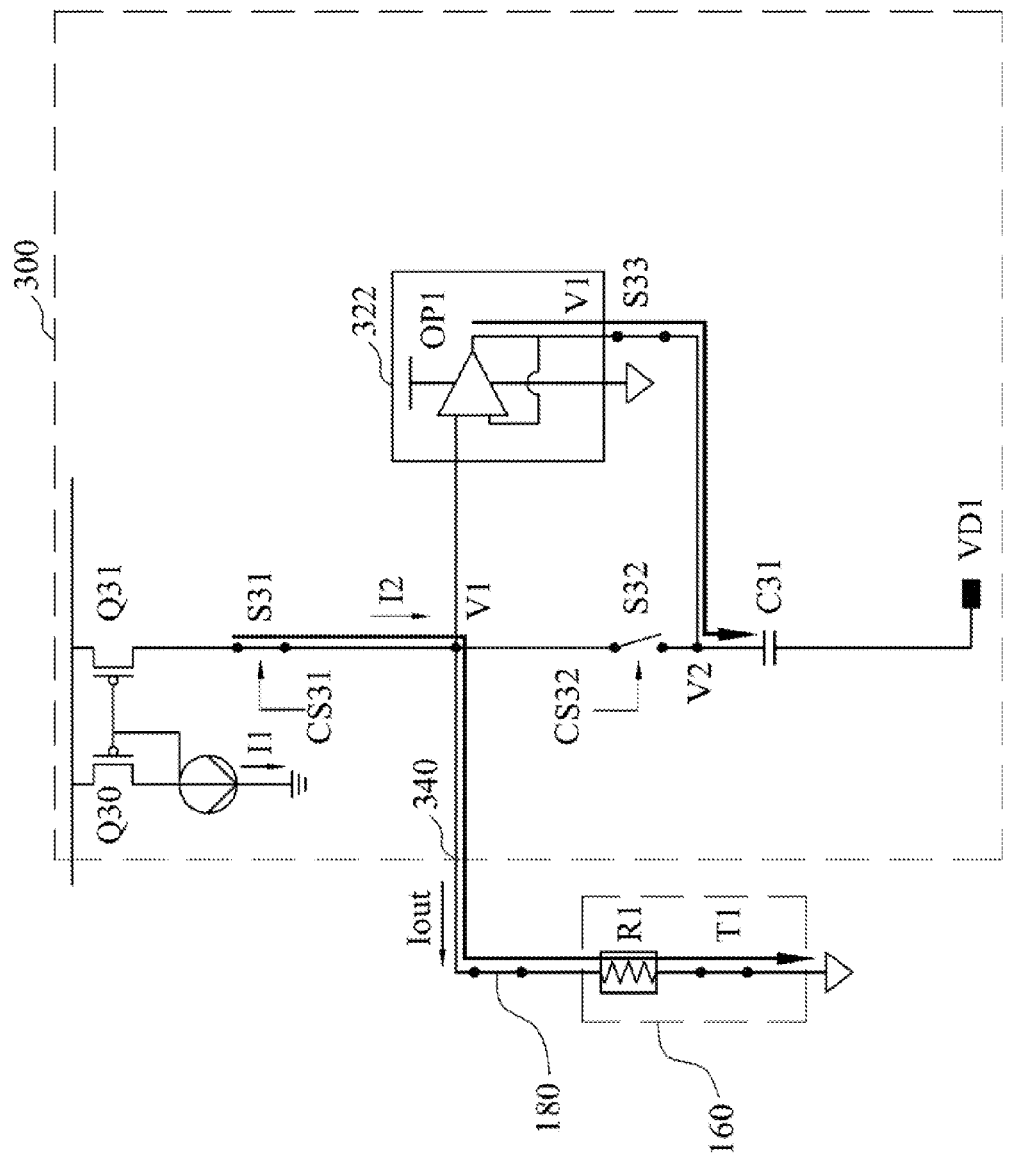
FIGS. 4A-4B are schematic diagrams illustrating operations of the memory driving circuit according to an embodiment of the present disclosure.
Figure 4B:
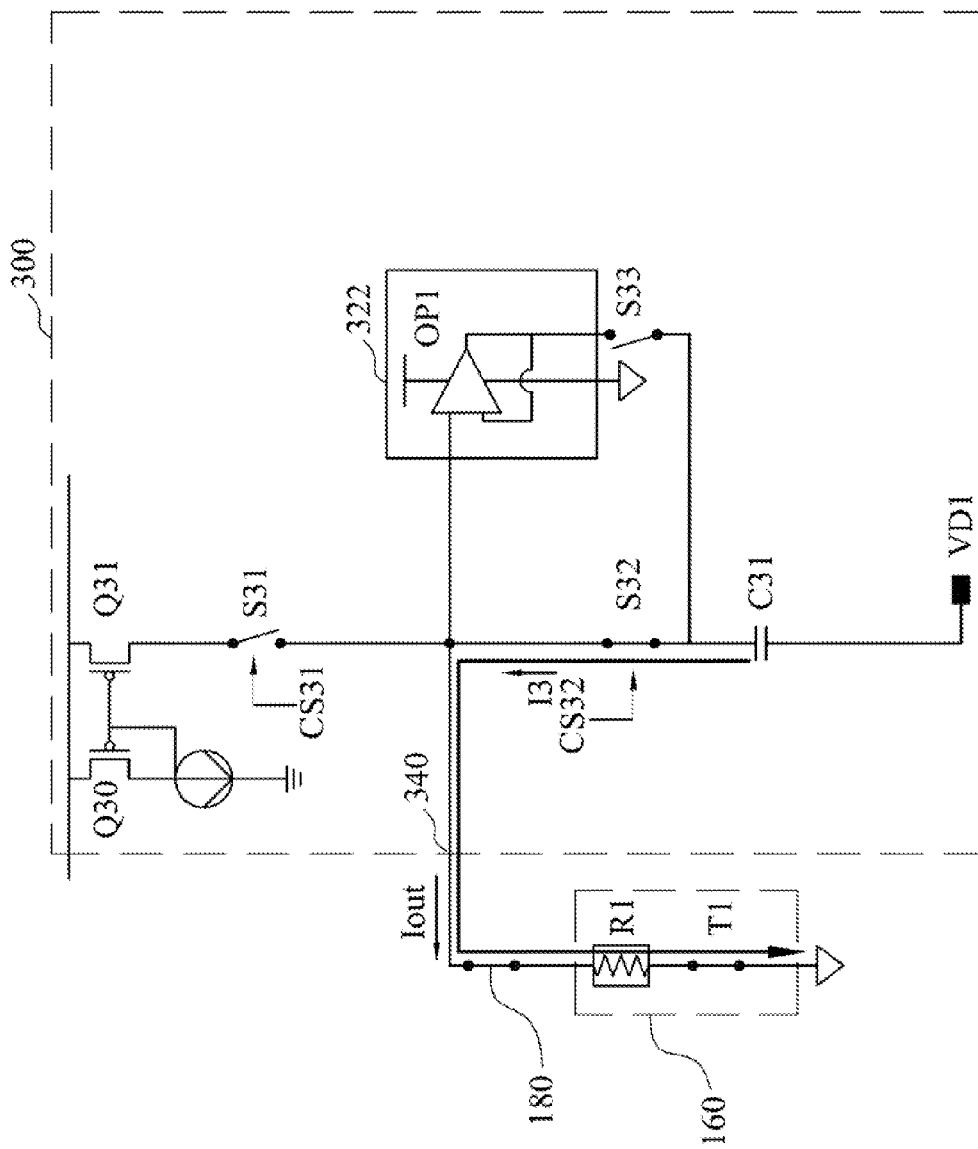

FIGS. 4A~4B are schematic diagrams illustrating operations of the memory driving circuit according to an embodiment of the present disclosure. As shown in FIG. 4A, in the fast transition stage, the switching unit S31 turns ON according to the corresponding control signal CS31 such that the current source 310 drives the memory cell 160 by using the second current I2 as the driving current Iout. In the present stage, the switching unit S32 turns OFF according to the corresponding control signal CS32, and the switching unit S33 is turned on during any time interval before the second switching unit being turned on such that the voltage generating unit 322 is configured to store a reference voltage V1 in the capacitive energy storage unit C31.

For example, in the present embodiment, the voltage generating unit 322 includes an operational amplifier OP1. The operational amplifier OP1 is connected to be a negative feedback loop, in which a first terminal is electrically connected to the switching unit S31, and a second terminal and an output terminal are electrically connected to the switching unit S33. Thus, the operational amplifier OP1 works as a voltage follower such that the voltage V2 of the output terminal has the same voltage level as the reference voltage V1.

In the slow transition stage, as shown in FIG. 4B, the switching unit S31 turns OFF according to the corresponding control signal CS31 to disconnect the current path between the current source 310 and the memory cell 160. The switching unit S33 also turns OFF to disconnect the current path between the voltage generating unit 322 and the capacitive energy storage unit C31. The switching unit S32 is configured to turn ON at the time the switching units S31 and S33 turn OFF, or after a short period following the switching units S31 and S33 turning OFF, such that the capacitive energy storage unit C31 is configured to output the third current I3 as the driving current to drive the memory cell 160. Thus, via the RC circuit formed by the capacitive energy storage unit C31 and the resistor R1 of the memory cell 160 itself, the third current I3 (i.e., the present driving current Iout) is configured to decrease smoothly with time, such that the smooth control of the driving current Iout is achieved.

The terminal voltage of the capacitive energy storage unit C31, according to the voltage generating unit 322, is controlled at the same reference voltage V1 of the switching unit S31. Therefore, when the switching unit S32 turns ON (and the switching unit S33 turns OFF at the same time), the terminal voltage of the memory driving circuit 300 will not change suddenly. Thus, the driving current Iout will not vary dramatically, so that the incorrect operation of the memory cell 160 will not occur.

The exemplary operations stated in the above embodiment may control the driving current Iout to decrease gradually. Moreover, it is noted that the driving circuit 300 may also be configured to operate in the slow transition stage first, and control the driving current Iout to gradually increase until reaching the maximum driving current Iout where it is held. For example, the memory driving circuit 300 may be configured to turn ON the switching units S31 and S32 at the same time, such that during the slow transition stage in which the switching unit S32 is ON, part of the second current I2 outputted by the current source 310 is conducted to charge the capacitive energy storage unit C31 and only part of the second current I2 works as the driving current Iout. As the charging of the capacitive energy storage unit C31 is approaching saturation, the driving current Iout will increase gradually until the switching unit S32 is turned OFF and all the second current I2 outputted by the current source 310 works as the driving current Iout for the memory cell 160. Specific details of the operations are similar to the aforementioned embodiment and are omitted herein for the sake of brevity. It is noted that, in all the aforementioned embodiments, when the switching unit S32 is ON, the switching unit S33 must be OFF, and when the switching unit S32 is OFF, the switching unit S33 is configured to be ON or OFF depending on whether it is necessary to charge the capacitive energy storage unit C31.

Reference is made to FIGS. 5A and 5B. FIGS. 5A and 5B are waveform diagrams illustrating the relationship between the driving current Iout and time of the memory driving circuit 300 shown in FIG. 3 according to an embodiment of the present disclosure. Curves L1, L2 and L3 are characteristic curves of the driving current Iout to time with different capacitance values of the capacitive energy storage unit C31. Curves L4, L5 and L6 are characteristic curves of the driving current Iout to time with different resistance values of the resistor R1 As shown in FIGS. 5A and 5B, at time t1, the memory driving circuit 300 is in the fast transition stage and configured to output the maximum driving current Iout. At time t2, the memory driving circuit 300 is switched to the slow transition stage and the driving current Iout decreases gradually, having different slew rates according to the different reference values of the resistance and the capacitance, and cutoffs at times t3, t4 and t5 respectively.

Reference is made to FIGS. 5C and 5D. FIGS. 5C and 5D are waveform diagrams illustrating the relationship between the driving current Iout and time of the memory driving circuit 300 shown in FIG. 3 according to an embodiment of the present disclosure. Curves L1, L2 and L3 are characteristic curves of the driving current Iout to time with different capacitance values of the capacitive energy storage unit C31. Curves L4, L5 and L6 are characteristic curves of the driving current Iout to time with different resistance values of the resistor R1. As shown in FIGS. 5C and 5D, the memory driving circuit 300 is in the slow transition stage at times t1, t2 and t3, and the driving current Iout increases gradually, having different change rates according to the different reference values of the resistance and the capacitance. At time t4, the memory driving circuit 300 is switched to the fast transition stage and configured to output the maximum driving current Iout until the driving current Iout cutoffs at time t5.

As shown in FIGS. 5A-5D, due to the fact that during the slow transition stage, the driving current Iout is determined by the time constant (i.e., the product of the resistance of the resistor R1 and the capacitance of the capacitive energy storage unit C31) of the RC circuit, the driving current Iout decreases (or increases) more slowly with a larger time constant, and decreases (or increases) faster with a smaller time constant. Thus, with a large capacitance value of the capacitive energy storage unit C31, the driving current Iout decreases slowly (as the curve L3 shows), and with a small capacitance value of the capacitive energy storage unit C31, the driving current Iout decreases quickly (as the curve L1 shows). Similarly, with a large resistance value of the resistor R1, the driving current Iout decreases (or increases) slowly (as the curve L6 shows), and with a small resistance value of the resistor R1, the driving current Iout decreases (or increases) quickly (as the curve L4 shows).

In addition, by changing the switching time of the switching unit S32, the characteristic curve of the driving current Iout during the slow transition stage may be adjusted accordingly. FIGS. 6A-6C and FIGS. 7A-76 are schematic diagrams illustrating the relationship between control signals and the driving current Iout according to an embodiment of the present disclosure. When the control signal CS32 is at a high level, the switching unit S32 is ON, and the capacitive energy storage unit C31 and the memory cell 160 are connected. On the other hand, when the control signal CS32 is at a low level, the switching unit S32 is OFF and the capacitive energy storage unit C31 and the memory cell 160 are disconnected.

In the embodiment shown in FIGS. 6A-6C (with additional reference made to FIGS. 3, 4A, and 4B), the memory driving circuit 300 is configured to control the driving current Iout into the fast transition stage to provide the maximum output, and then into the slow transition stage to gradually decrease the driving current Iout. As shown by the curve L7 of FIG. 6A, when the switching unit S31 is OFF, the switching unit S32 does not turn ON immediately, and turns ON instead after a delayed period (i.e., the period P1 in FIG. 6A), the change rate of the driving current Iout before the switching unit S32 turns ON is relatively large compared to the change rate of the driving current Iout after the switching unit S32 turns ON (i.e., the period P2 in FIG. 6A). Similarly, as shown by the curve L8 of the FIG. 6B, if the switching unit S32 turns OFF at the time after a conducting period (i.e., the period P3 in FIG. 6B), the change rate of the driving current Iout after the switching unit S32 turns OFF (i.e., the period P4 in FIG. 6B) is relatively large. On the other hand, as shown in FIG. 6C, if the switching unit 332 turns ON immediately when the switching unit S31 turns OFF and the switching unit S32 keeps the turn ON state, the driving current Iout in the slow transition stage decreases steadily with a constant change rate.

Similarly, in the embodiments shown in FIGS. 7A-7B, the memory driving circuit 300 is configured to control the driving circuit Iout into the slow transition stage to gradually increase the driving current Iout, and then into the fast transition stage to provide the maximum output. Similarly, as shown in the curve L11 of FIG. 7A, if the switching unit S32 turns OFF at the time after a conducting period (i.e., the period P5 in FIG. 7A), the change rate of the driving current Iout after the switching unit S32 turns OFF (i.e., the period P6 in FIG. 7A) is relatively large. On the other hand, as shown in curve L12 of FIG. 7B, if the switching unit S32 turns ON immediately when the switching unit S31 turns OFF and the switching unit S32 keeps the turn ON state, the driving current Iout in the slow transition stage increases steadily with a constant change rate. Thus, by controlling and adjusting an ON time and an OFF time of the switching unit S32, the characteristics and the change rate of the driving current Iout in the slow transition stage (e.g. third current I3) may be controlled to meet actual driving configurations.

Figure 8:
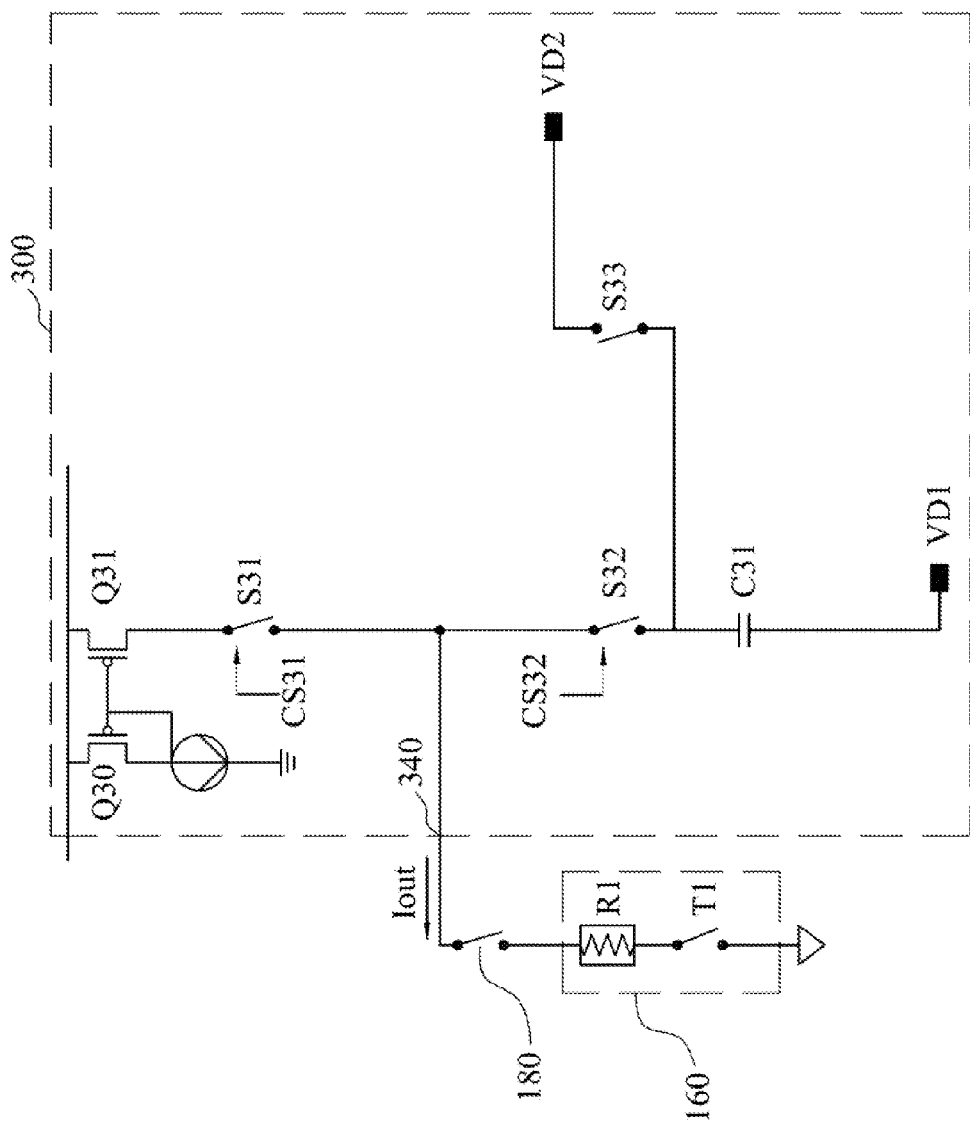
FIG. 8 is a schematic diagram illustrating a memory driving circuit according to an embodiment of the present disclosure.

In some embodiments, the voltage generating unit 322 may be implemented using configurations other than the operational amplifier. Reference is made to FIG. 8. FIG. 8 is a schematic diagram illustrating the memory driving circuit 300 according to another embodiment of the present disclosure. As shown in FIG. 8, the voltage generating unit 322 may be implemented by another voltage current source V02 to provide the reference voltage V1, in order to control the initial voltage value of the capacitive energy storage unit C31.

Figure 9A:
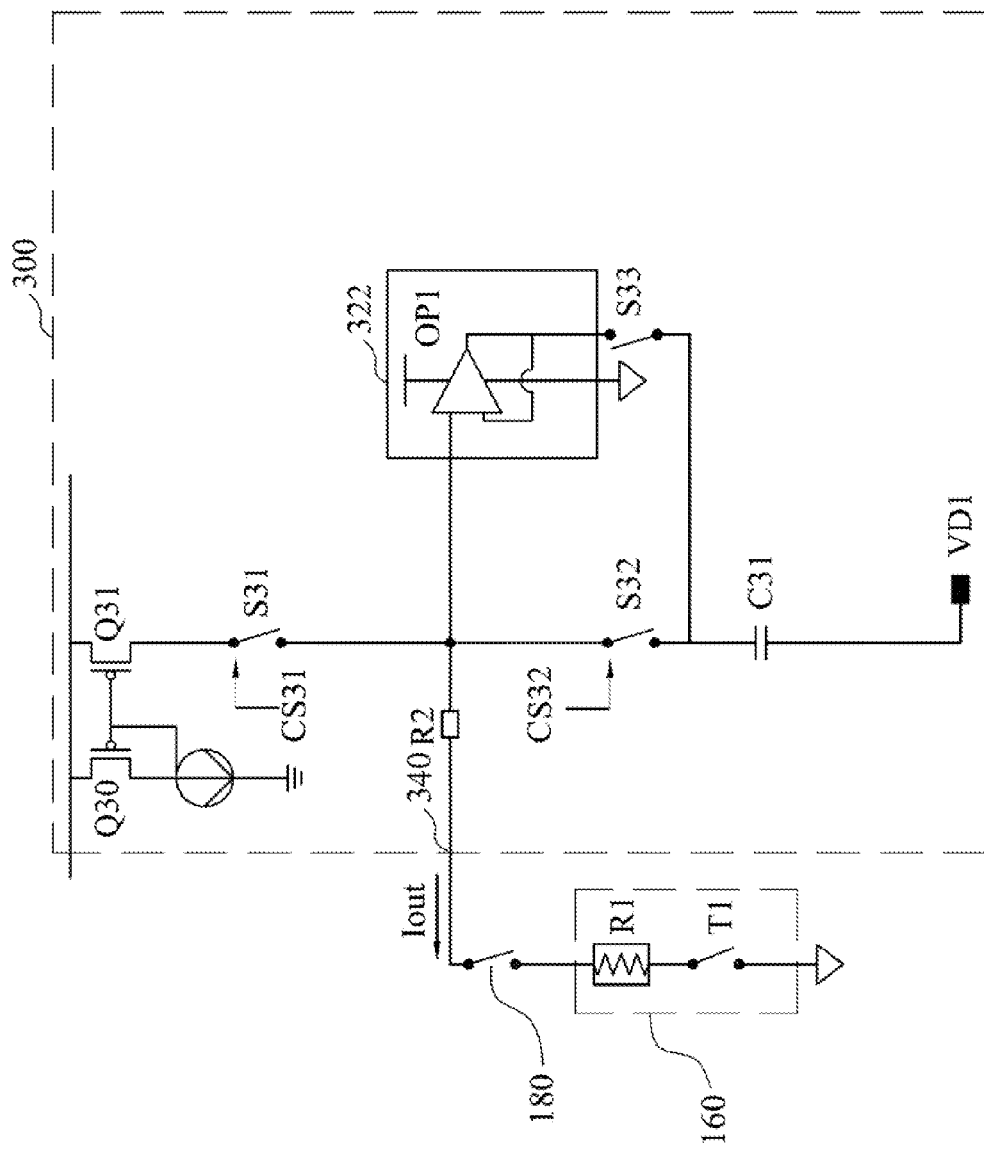
FIGS. 9A-9C are schematic diagrams illustrating memory driving circuits according to an embodiment of the present disclosure.

To further adjust the change rate of the driving current Iout during the slow transition stage, in some embodiments, the memory driving circuit 300 further includes compensating resistor units R2, R3 or R4. The compensating resistor units R2, R3 or R4 are electrically connected to the capacitive energy storage unit C31 in series to adjust the change rate of the third current I3, such that the change rate of the driving current Iout is adjusted. For example, as shown in FIG. 9A, a first terminal of the compensating resistor unit R2 is electrically connected to the switching unit S31, and a second terminal of the compensating resistor unit R2 is electrically connected to the memory cell 160.

Figure 9B:
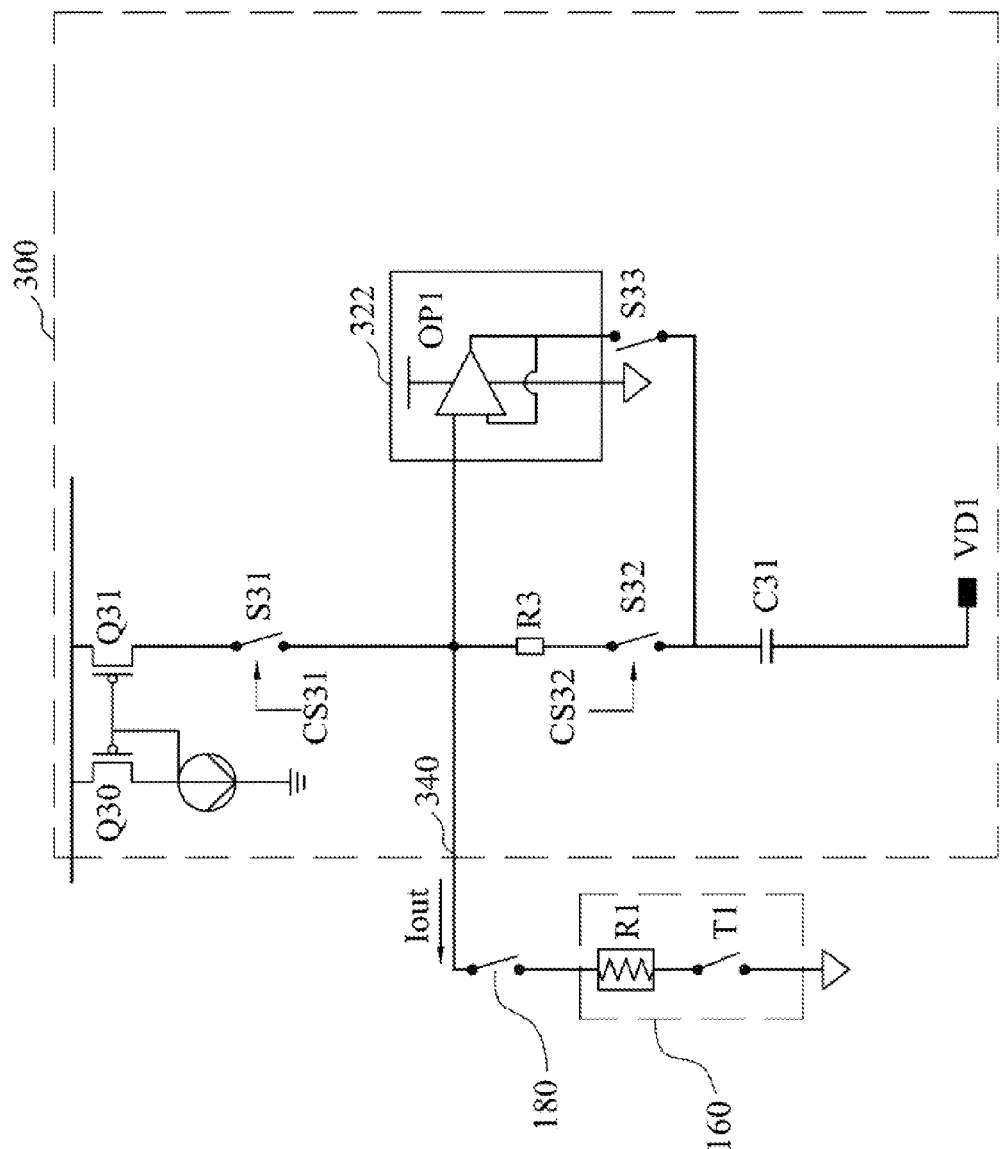
Figure 9C:
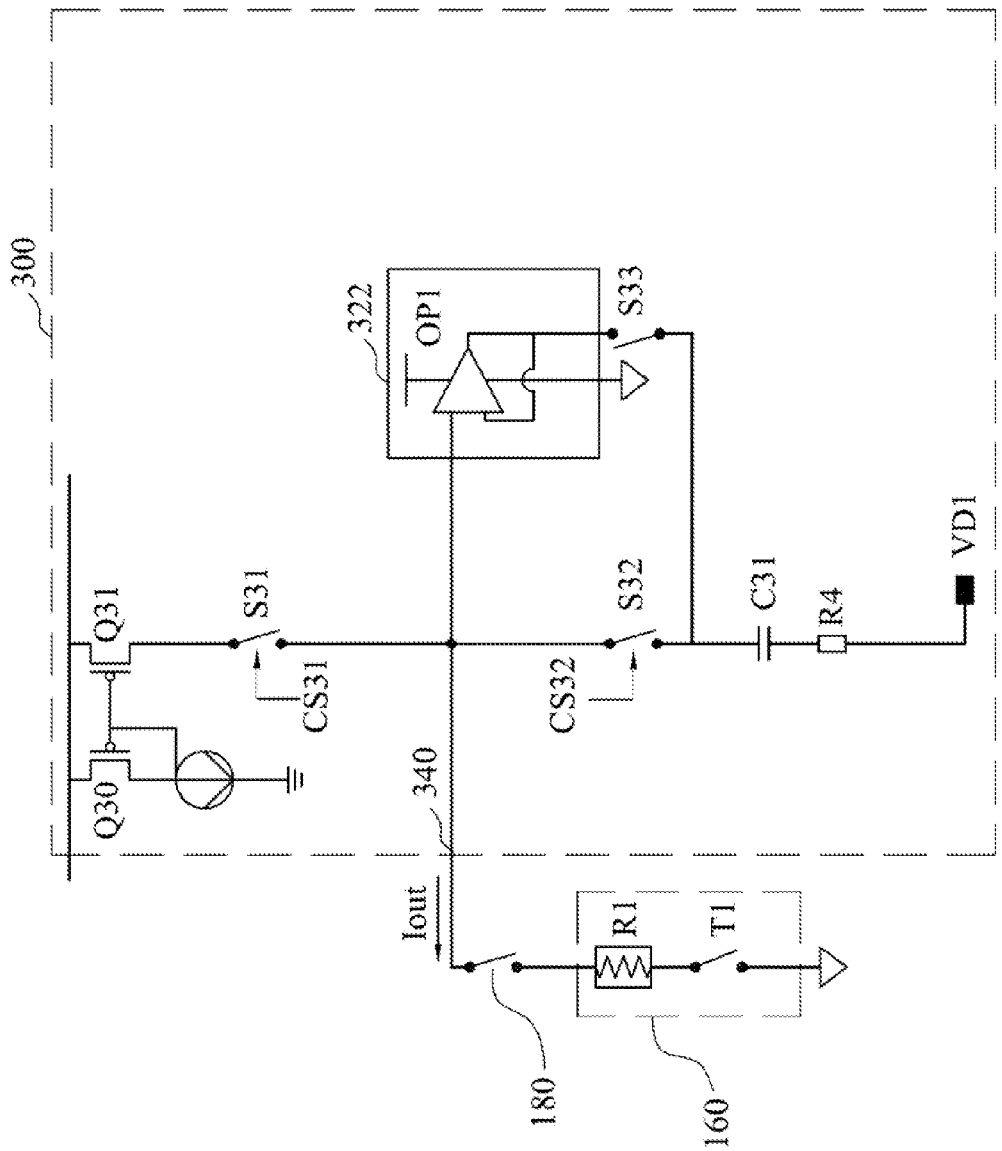

In another embodiment, as shown in FIG. 9B, a first terminal of the compensating resistor unit R3 is electrically connected to the switching unit S31, and a second terminal of the compensating resistor unit R3 is electrically connected to the switching unit S32. In yet another embodiment, as shown in FIG. 9C, a first terminal of the compensating resistor unit R4 is electrically connected to the capacitive energy storage unit C31, and a second terminal of the compensating resistor unit R4 is electrically connected to the voltage source VD1.

Figure 10A:
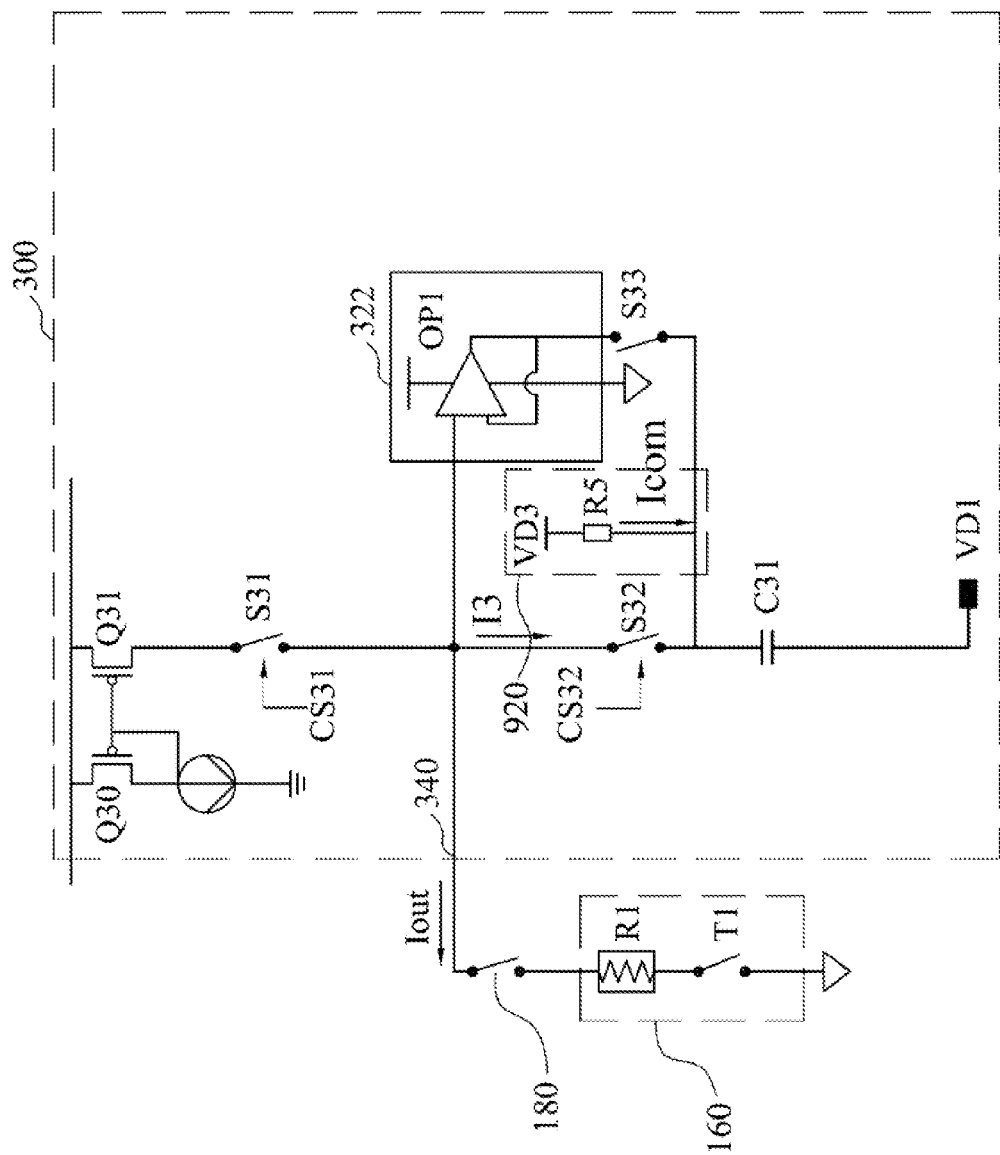
FIGS. 10A-10B are schematic diagrams illustrating memory driving circuits according to an embodiment of the present disclosure.
Figure 10B:
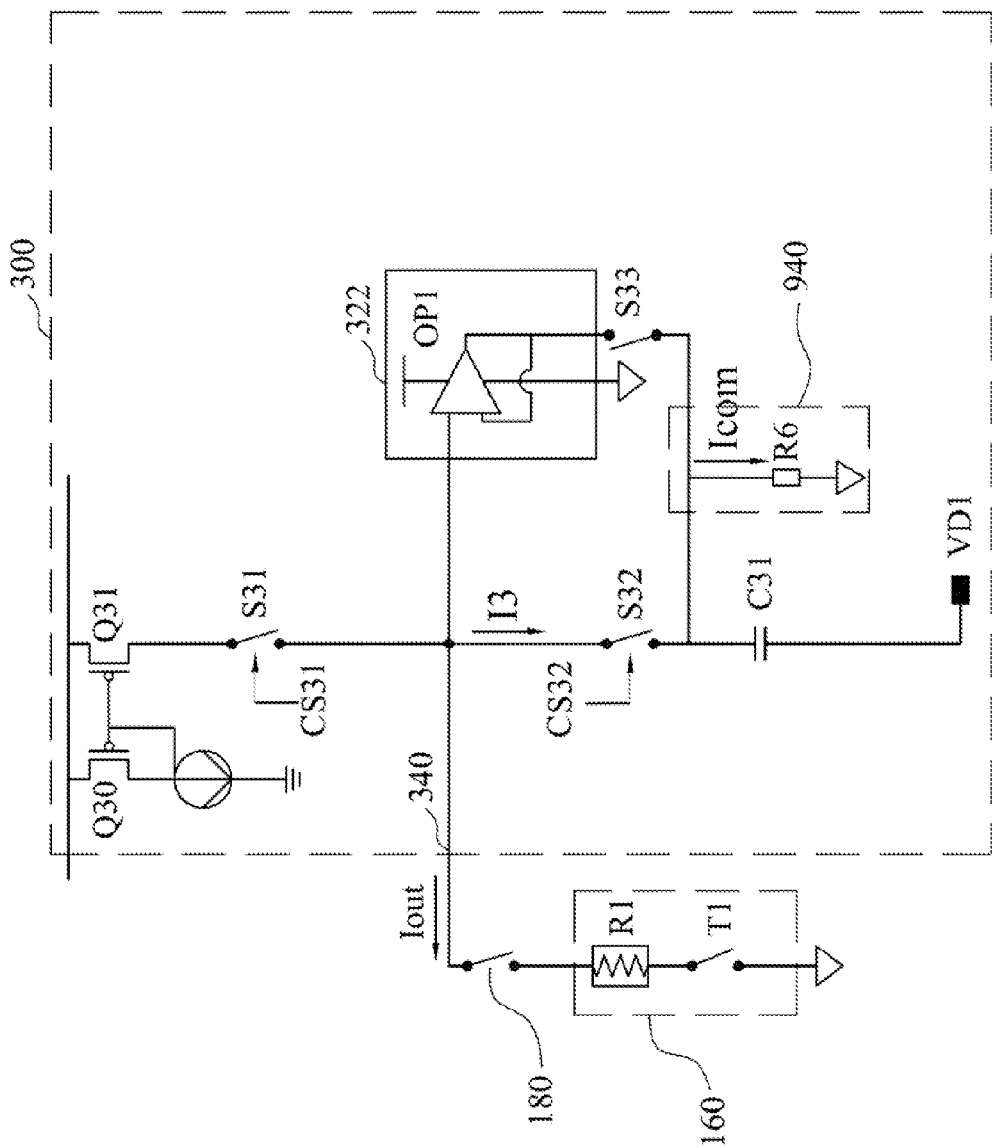

In addition, to adjust the change rate of the driving current Iout, in some embodiments, the memory driving circuit further includes a current providing unit or a current absorption unit. Reference is made to FIGS. 10A and 10B. In the embodiment shown in FIG. 10A, the current providing unit 920 includes a voltage source VD3 and a resistor unit R5. A first terminal of the resistor unit R5 is electrically connected to the voltage source VD3, and a second terminal of the resistor unit R5 is electrically connected to the capacitive energy storage unit C31. Thus, in the slow transition stage, when the capacitive energy storage unit C31 is configured to discharge or charge, the current providing unit 920 may be configured to provide a compensating current Icom to charge the capacitive energy storage unit C31 in order to adjust the change rate of the third current I3. In some embodiments, the voltage source VD3 may be a ground point.

In the embodiment shown in FIG. 10B, the current absorption unit 940 includes a resistor unit R6. A first terminal of the resistor unit R6 is electrically connected to the capacitive energy storage unit C31, and a second terminal of the resistor unit R6 is electrically connected to the ground. Thus, in the slow transition stage, when the capacitive energy storage unit C31 is configured to discharge or charge, the current absorption unit 940 may be configured to sink an absorption current Icom to the ground in order to adjust the change rate of the third current I3. In the above embodiments, the current providing unit 920 and the current absorption unit 940 may also be implemented by a compensating current mirror circuit (not shown), to provide or absorb the compensating current Icom to adjust the change rate of the third current. One skilled in the art will be able to understand how to implement the current providing unit 920 and the current absorption unit 940 by compensating current mirror circuits, and therefore, further explanation in this regard is omitted herein for the sake of brevity.

It is noted that in the aforementioned embodiments of the present disclosure, each functional unit may be implemented in many different ways. For example, the resistor units R1~R6 may be achieved by a single resistor, multiple resistors connected in series or in parallel, or other resistive semiconductor elements such as diodes, biased Metal-Oxide-Semiconductor Field-Effect Transistors (MOSFETs) or bipolar junction transistors (BJTs). The capacitive energy storage unit may be achieved by a capacitor or other capacitive semiconductor elements such as MOSFETs, Metal-Insulator-Metal (MIM) capacitor or Metal-Oxide-Metal (MOM) capacitor. Similarly, the switching units (or switches) may be achieved by MOSFETS, BJTs, etc. The elements listed above are only given by way of example and are not meant to limit the present disclosure. It will be apparent to those skilled in the art that various modifications and variations can be made without departing from the scope or spirit of the disclosure.

Figure 11:
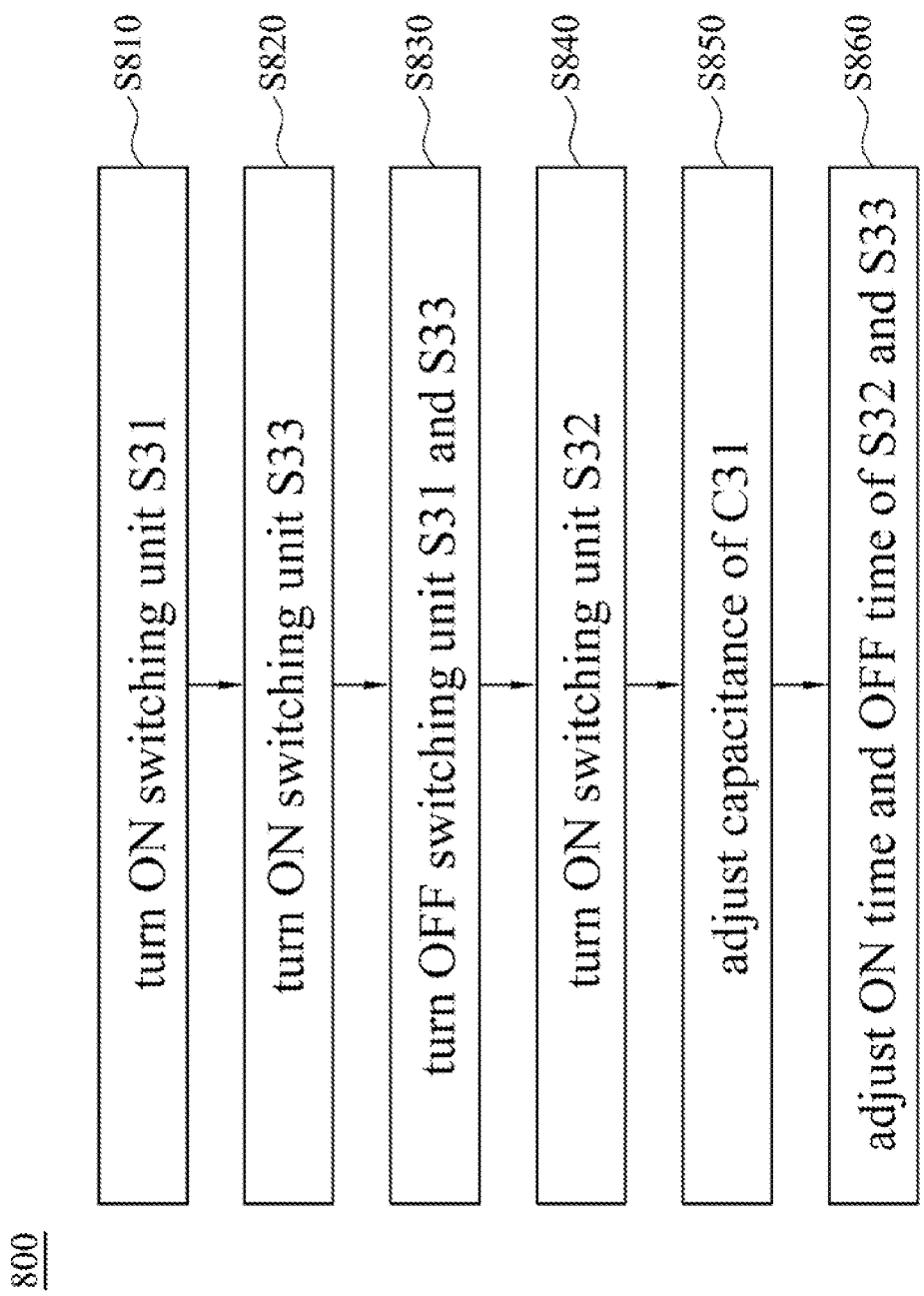
FIG. 11 is a flowchart illustrating a writing method of a memory according to an embodiment of the present disclosure.

Reference is made to FIG. 11. FIG. 11 is a flowchart illustrating a memory writing method 800 according to an embodiment of the present disclosure. The memory writing method 800 includes steps S810, S820, S830 and S840, which will be described in detail in the following paragraphs. For better understanding of the present disclosure, the following memory writing method 800 is discussed in relation to the embodiment shown in FIG. 3, and FIG. 4A-4B, but is not limited thereto. First, in step S810, the switching unit S31 is turned ON to conduct the current source 310 (e.g., the current mirror circuit) and the memory cell 160, such that the second current I2 outputted by the current source 310 (e.g. the current mirror circuit) is configured to drive the memory cell 160. Next, in step S820, the switching unit S33 is turned ON so that energy is stored in the capacitive energy storage unit C31 according to the reference voltage V1. Next, in step S830, the switching units S31 and S33 are turned off to disconnect the current source 310 (e.g., the current mirror circuit) and the memory cell 160, and to disconnect the capacitive energy storage unit C31 and the voltage generating unit 322. In the present stage, the voltage level of the capacitive energy storage unit C31 is maintained at the reference voltage V1. Finally, in the step S840, the switching unit S32 is turned ON to conduct the capacitive energy storage unit C31 and the memory cell 160, such that the third current I3 outputted by the capacitive energy storage unit C31 is configured to drive the memory cell 160.

In some embodiments, the memory writing method 800 further includes steps S850 and S860. In step S850, a capacitance of the capacitive energy storage unit C31 is adjusted to control the change rate of the third current I3. In step S860, an ON time and an OFF time of the switching unit S32 and S33 are adjusted to control the change rate of the third current I3.

The above description includes exemplary operations, but the operations are not necessarily performed in the order described. The order of the operations disclosed in the present disclosure may be changed, or the operations may even be executed simultaneously or partially simultaneously as appropriate, in accordance with the spirit and scope of various embodiments of the present disclosure. For example, in the embodiment in which the memory driving circuit 300 is configured to control the driving current Iout into the slow transition stage to gradually increase the driving current Iout until reaching the maximum output where it is maintained, the switching units S31 and S32 may be configured to turn ON at the same time. Details of such operations are fully disclosed in the above paragraphs and are therefore omitted herein for the sake of brevity.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory driving circuit, comprising:
   a current source configured to output a second current;
   a first switching unit configured to undergo switching to connect to the current source selectively to output the second current;
   a voltage generating unit configured to provide a reference voltage;
   a capacitive energy storage unit configured to receive the reference voltage from the voltage generating unit and store energy according to the reference voltage generated by the voltage generating unit;
   a third switching unit configured to undergo switching to connect the voltage generating unit and the capacitive energy storage unit selectively;
   a second switching unit configured to undergo switching to connect the capacitive energy storage unit selectively to output a third current; and
   a current output terminal configured to selectively output an output current, wherein the output current is configured to be the second current, the third current, or the sum of the second current and the third current according to the operation of the first switching unit and the second switching unit.

2. The memory driving circuit of claim 1, further comprising:
   a memory cell, wherein the memory driving circuit is configured to drive the memory cell via the current output terminal.

3. The memory driving circuit of claim 2, wherein the memory cell comprises a phase change memory, a resistance memory, or a magnetoresistive memory.

4. The memory driving circuit of claim 1, wherein the current source comprises a current mirror circuit, wherein the current mirror circuit is configured to output the corresponding second current according to a first current.

5. The memory driving circuit of claim 1, wherein the voltage generating unit comprises:
an operational amplifier, wherein a first input terminal of the operational amplifier is electrically connected to the first switching unit and the current output terminal, and a second input terminal and an output terminal of the operational amplifier are electrically connected to the third switching unit.

6. The memory driving circuit of claim 1, wherein the voltage generating unit comprises:
a voltage current source electrically connected to the third switching unit.

7. The memory driving circuit of claim 1, further comprising a compensating resistor unit electrically connected to the capacitive energy storage unit in series, and configured to adjust the change rate of the third current.

8. The memory driving circuit of claim 1, further comprising a compensating resistor unit, wherein the compensating resistor unit comprises:
a first terminal electrically connected to the first switching unit; and
a second terminal electrically connected to the current output terminal.

9. The memory driving circuit of claim 1, further comprising a current providing unit electrically connected to the capacitive energy storage unit and configured to provide a compensating current or absorption current to adjust the change rate of the third current.

10. The memory driving circuit of claim 9, wherein the current providing unit comprises a voltage source and a resistor unit, wherein a first terminal of the resistor unit is electrically connected to the voltage source, and a second terminal of the resistor unit is electrically connected to the capacitive energy storage unit.

11. The memory driving circuit of claim 1, wherein the third switching unit is turned on at any time in the time interval of the first switching unite in a conducting state and the second switching unite in an open state, such that the voltage generating unit is configured to generate the reference voltage, and the third switching unit is turned off before the second switching unit being about to conduct, and is maintained in an open state during a conducting interval of the second switching, such that the reference voltage is stored to the capacitive energy storage unit.

* * * * *